United States Patent [19]

Palecek et al.

[11] Patent Number: 4,774,763
[45] Date of Patent: Oct. 4, 1988

[54] ELECTRICAL CONTACT WITH COMPLIANT MOUNTING SECTION

[75] Inventors: Vincent J. Palecek, Cicero; Dennis R. Eul, Palatine, both of Ill.

[73] Assignee: Methode Electronics, Inc., Chicago, Ill.

[21] Appl. No.: 900,716

[22] Filed: Aug. 27, 1986

[51] Int. Cl.⁴ .................................... H01R 43/16
[52] U.S. Cl. ................................................ 29/874
[58] Field of Search ............... 29/874, 33 Q, 33 S, 29/882, 733, 751; 409/131, 132

[56] References Cited

U.S. PATENT DOCUMENTS

| | | | |
|---|---|---|---|
| 3,545,080 | 12/1970 | Evans | 29/874 |
| 3,675,320 | 7/1972 | Watanabe | 29/874 |
| 3,758,944 | 9/1973 | Berg | 29/874 |
| 4,066,326 | 1/1978 | Lovendusky | 439/876 |
| 4,186,982 | 2/1980 | Cobaugh | 439/751 |
| 4,655,537 | 8/1986 | Andrews, Jr. | 439/751 |

*Primary Examiner*—William R. Briggs
*Attorney, Agent, or Firm*—Charles F. Pigott, Jr.

[57] ABSTRACT

A method of making an electrical contact intended to be inserted into a plated-through hole in a printed circuit board including a compliant section which engages the inside of the hole in an interference fit thereby gripping the sides of the hole to retain the pin therein providing excellent electrical integrity without need for soldering.

7 Claims, 2 Drawing Sheets

ELECTRICAL CONTACT WITH COMPLIANT MOUNTING SECTION

BRIEF SUMMARY OF THE INVENTION

It is known in the art to provide an electrical contact or pin having a compliant section for engagement with the inside of a plated-through hole in a printed circuit board. Such a compliant section is formed intermediate the two ends of the pin and is sized and must be compressed for the pin to be inserted into the hole. The compliant section must also be sufficiently resilient to produce a predetermined minimum pullout force due to the engagement of the compliant section with the inside of the plated through hole.

The compliant pin of the present invention has a so-called "needle-eye" compliant section, meaning that the compliant section comprises two arcuate leg members which define an opening or "needle-eye" between them. The maximum distance between the outer surfaces of the two leg members defines the outer diameter of the compliant section, and such outer diameter is deliberately made larger than the inside diameter of a plated-through hole. As a result when the pin is pressed into such a hole the legs of the compliant section will be deflected toward one another and will grip and slightly deform the inside of the hole to retain the pin providing excellent electrical integrity without need for soldering.

The conventional method for making a "needle eye" compliant pin is to punch the pin including the compliant section from a flat sheet of metal thereby punching the two arcuate legs and a "needle eye" opening between them, as well as the head and tail portions of the pin. However, there are disadvantages to such a method because the punches are usually made in very small sizes and it is difficult to maintain the tooling required for the punching operation.

In addition, when the compliant section is created by a punching operation, the dimensions of the section including the widths of the two arcuate legs are of limited accuracy with the result that there may be problems caused by differences in the widths of the two leg members. Thus, the dimensions of the two arcuate leg members control their flexibility, and if such members are not precisely the same width, one leg will flex more readily than the other when the pin is pressed into a plated through hole, thereby causing undesirable twisting or leaning of the tail of the pin.

It is also known in the art to form the two leg portions of a compliant pin section by shearing the legs from a flat piece of material. According to this technique, a punching operation is carried out whereby the two legs are forced in opposite directions creating a shear line between them thus creating two independent legs from an integral length of material which may be square or rectangular in cross-section. Such a shearing operation is disclosed in U.S. Pat. 4,186,982, which is assigned to AMP Incorporated.

However, the foregoing patent teaches shearing of the leg members without creating any opening or "needle eye" between them. It discloses a pin where the two leg members are deliberately left in overlapping relation with no opening between them so they will rub against one another and create a frictional force which increases the stiffness or rigidity of the compliant section. In contrast, while the present invention utilizes a shearing operation, it involves shearing the legs to move them sufficiently apart to create a substantial opening between them, whereby the legs do not overlap and frictional forces between the two legs are eliminated which substantially reduces the rigidity of the compliant section.

It is important to understand that compliant pins of the type with which the present invention is concerned must be made to exacting standards and meet demanding specifications. For example, a typical specification requires that the force required to press or insert a pin into a minimum diameter plated-through hole must not exceed 40 pounds, while at the same time the force required to pull such a pin out of a maximum diameter hole in which it has been pressed must not be less than 10 pounds.

Moreover, such requirements must be satisfied even though there are permissible variations between the size of a given hole. One industry standard provides that plated-through holes in a circuit board should have a diameter having a tolerance of plus or minus 0.003 inch. Accordingly, a compliant pin must meet the maximum 40-pound insertion force in the smallest permissible hole and at the same time meet the minimum 10-pound pullout force in the largest permissible hole, which means the flexibility and resilience of the compliant section of the pin are of critical importance.

It is therefore an object of the present invention to provide a compliant pin which is sufficiently flexible to avoid damaging a plated-through hole in which it is pressed, and yet is sufficiently resilient to meet requirements for a minimum pull-out force even where the hole diameter is the maximum afforded by permissible tolerances.

A further related object is to provide a pin having a compliant section comprising two arcuate leg members disposed in different but parallel planes and sufficiently spaced apart to form a substantial opening between them thereby eliminating friction forces between the leg members.

Another object of our invention is to provide a unique method of manufacture of a compliant pin which assures uniformity in the width of two arcuate leg members in the compliant section thereby assuring that the legs will exhibit substantially identical flexibility characteristics when the pin is pressed into a plated-through hole.

A further object of our invention is to provide a compliant pin having a "needle-eye" opening which is formed by shearing or punching two leg members from an elongated section which is generally rectangular in cross-section.

The foregoing and other objects and advantages of the invention will be apparent from the following description of a preferred embodiment, taken in conjunction with the accompanying drawings.

DESCRIPTION OF THE DRAWINGS

FIG. 6b is a side view of the individual pin shown in FIG. 6a; and

Now, in order to acquaint those skilled in the art with the manner of making and using our invention, we shall describe, in conjunction with the accompanying drawings, a preferred embodiment of the invention.

DETAILED DESCRIPTION OF THE INVENTION

Figure 1:
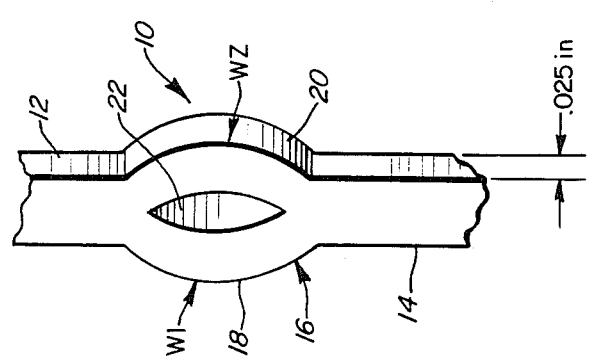
FIG. 1 is a perspective view of a prior art pin where the compliant section is created by punching the same from a flat sheet of metal thereby forming a pair of coplanar leg members with a space or "needle-eye" between them.

Referring now to the drawings, FIG. 1 shows a prior art compliant pin 10 which is stamped or punched from a flat sheet of metal having a thickness of 0.025 inch. The pin 10 comprises a head or upper end 12, a tail portion 14, and an intermediate compliant section 16 which is intended to be pressed into a plated-through hole in a printed circuit board. The compliant section 16 includes a pair of arcuate legs 18 and 20 having an opening or "needle-eye" 22 therebetween.

The pin 10 including the compliant section 16 is formed by punching the same from a flat sheet of metal to form the two ends of the pin and the compliant section. It is highly desirable that the width $W_1$ of the leg 18 be the same as the width $W_2$ of the leg 20, so that when the compliant section 16 is pressed into a plated-through hole thereby deflecting the arcuate leg members 18 and 20 toward one another, the legs will exhibit equal characteristics of flexibility. However, as mentioned earlier herein, one of the problems with the small tooling required is that great accuracy in controlling the respective widths of the legs 18 and 20 is not possible. The width of the two legs may therefore differ from one another causing a difference in the flexibility characteristics of the legs which can result in cocking or leaning of a pin in a hole into which it is pressed.

We have also found that where the pin is stamped from a flat metal sheet as represented by the prior art pin shown in FIG. 1, the two coplanar leg members 18 and 20 exhibit greater rigidity and less resilience than a pin constructed in accordance with the present invention. In accordance with the present invention, the arms do define an opening or "needle-eye" between them, but they also operate independently without frictional forces between the arms. In addition, the arms are oriented in separate, parallel planes resulting in a design which increases the resiliency of the arms when they are deflected toward one another.

Figure 4:
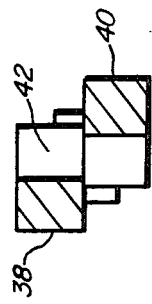
FIG. 4 is an enlarged cross-sectional view taken through the line 4—4 of FIG. 3.
Figure 3:
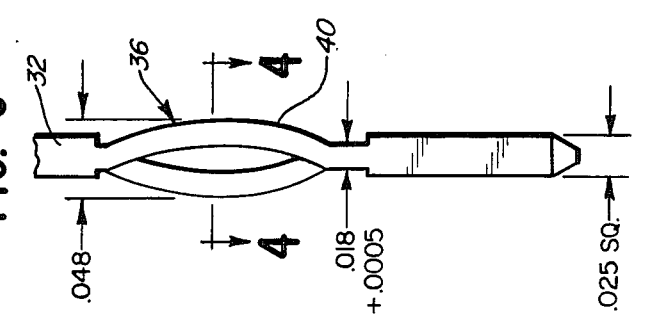
FIG. 3 is a front elevational view of the compliant pin of FIG. 2.
Figure 2:
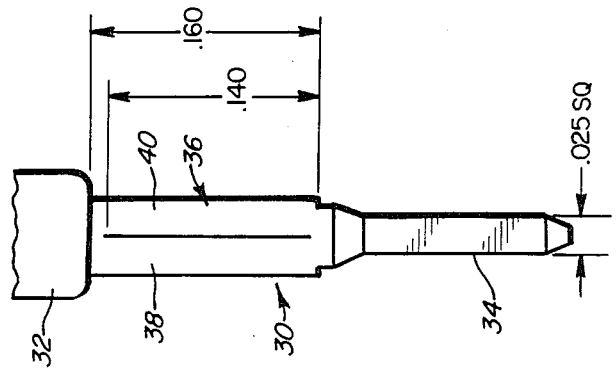
FIG. 2 is a side elevational view of a compliant pin constructed in accordance with the present invention.

Reference is now made to FIGS. 2–4 which illustrate a pin constructed in accordance with the present invention. There is shown a compliant pin 30 having a head or top portion 32, a tail portion 34, and an intermediate compliant section 36. The compliant section 36 includes a pair of arcuate legs 38 and 40 which (as shown in FIG. 3) are bowed away from each other to define a space or "needle-eye" opening 42 between them.

It is also important to note that the legs 38 and 40 are not coplanar as in the case of the prior art compliant pin 10 shown in FIG. 1. Instead, the legs are in adjacent, parallel planes so each leg can flex independently of the other. Moreover, unlike the compliant pin shown in the previously mentioned U.S. Pat. No. 4,186,982, the two legs are sufficiently bowed apart that there is no overlapping between them and thus no frictional forces are developed during flexing of the leg members.

The foregoing is important because having the two legs 38 and 40 in separate planes in a relationship where there is virtually no overlapping between them has been found to afford important advantages. These advantages include the fact that a compliant pin constructed according to the present invention tends to be quite flexible so there is no problem meeting necessary requirements as to a maximum insertion force even where the smallest permissible holes are encountered. At the same time, pins according to the present invention have been found to provide exceptional resiliency so that after insertion the legs 38 and 40 grip the inside of a hole into which they are pressed to readily meet minimum pull-out forces even where the largest permissible holes are encountered.

By way of example only, certain dimensions are shown in FIGS. 2 and 3. One such dimension, shown in FIG. 3 as 0.018 inch, is the width of a section immediately below the lower ends of the legs 38 and 40 and also is the precise width of each leg throughout its length. It is important to have such uniformity in the width of the legs 38 and 40 to assure they exhibit substantially identical flexibility characteristics. The manner in which such accuracy in the width of the legs is achieved will be explained hereinafter in connection with a description of the method of producing the compliant pin 30.

Reference is also made to the dimension, shown in FIG. 3 as 0.9048 inch, which is the distance between the outsides of the bowed legs 38 and 40. The foregoing dimension is important because it comprises the outer diameter of the pin 30. The foregoing dimension together with the inside diameter of a hole into which the pin is pressed determine the degree of the interference fit and thus the insertion and withdrawal forces exhibited by the pin.

Figure 5A:
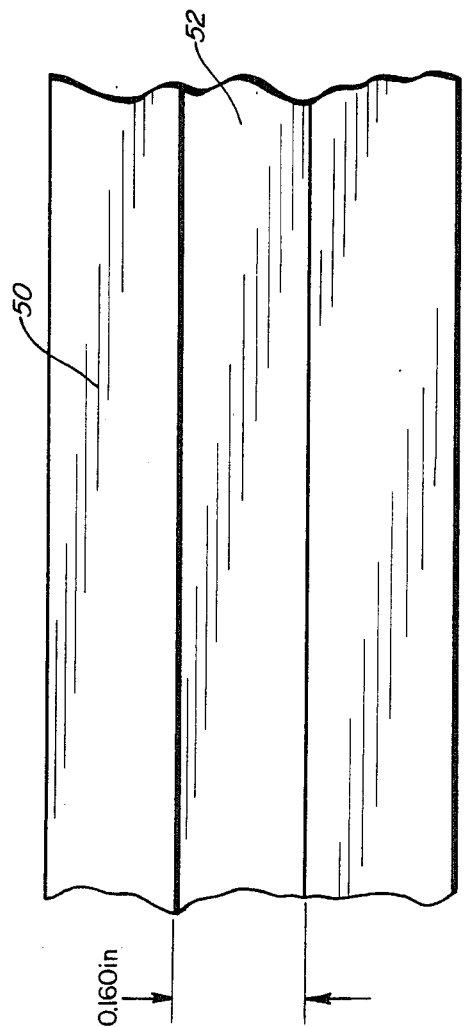
FIG. 5a is a fragmentary top plan view of a metal sheet from which a plurality of individual pins are formed, there being shown a central strip or path of reduced thickness which is formed by a pre-milling operation carried out on opposite sides of the sheet along the length thereof.

Reference is now made to FIGS. 5–7 which illustrate the method of the present invention. FIG. 5a is a top plan view of a flat sheet of metal from which a plurality of compliant pins may be produced by certain milling, forming and punching or shearing operations. The metal sheet shown generally at 50 has a predetermined width (the vertical dimension shown in FIG. 5a) which corresponds generally to the desired length of the contacts or pins to be produced.

The thickness of the metal sheet, by way of example, is initially 0.025 inch, and it will be seen from FIGS. 2 and 3 that the foregoing dimension is related to the final size of the formed tail 34 which is 0.025 inch square in cross-section. As for the length of the metal sheet 50 (the left-to right dimension as shown in FIG. 5a), the preferred procedure is to feed a continuous strip of metal into a forming die whereby at each stage of the operation a portion of the desired pin is formed or punched.

Still referring to the continuous length of the metal strip shown at 50 in FIG. 5a, the first step is a pre-milling operation carried on by an end mill, whereby a path of reduced thickness is created by milling the opposite sides of the metal strip 50. Such a path is shown at 52 in FIG. 5a, the path having a width of 0.160 inch.

Figure 5B:
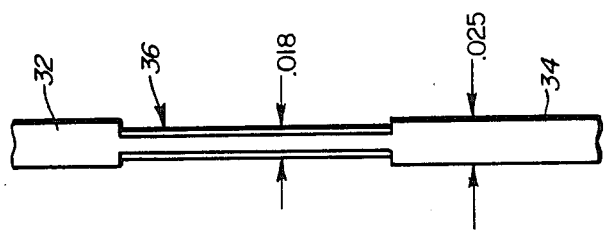
FIG. 5b is an end view of the metal sheet of FIG. 5a illustrating the section of reduced thickness formed by a pre-milling operation.

By way of example, the end milling operation carried out on opposite sides of the metal strip 50 reduces the thickness of the metal strip from 0.025 inch to 0.018 inch, as best shown in FIG. 5b which is an end view of the strip. It will further be noted that the width of the reduced path, 0.160 inch as shown in FIGS. 5a and 5b, corresponds with the length of the compliant section shown at 36 in FIGS. 2 and 3.

Figure 6A:
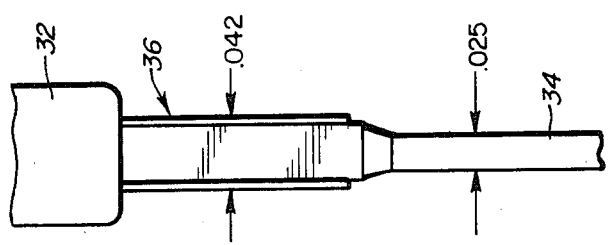
FIG. 6a is a top plan view showing one of a series of individual pins formed by punching the same seriatim out of the metal sheet of FIG. 5a, there being shown a compliant pin having the dimensions illustrated in FIG. 2 but prior to the shearing or punching operation where the two arcuate legs are sheared from the solid length of material comprising the compliant section.
Figure 6B:
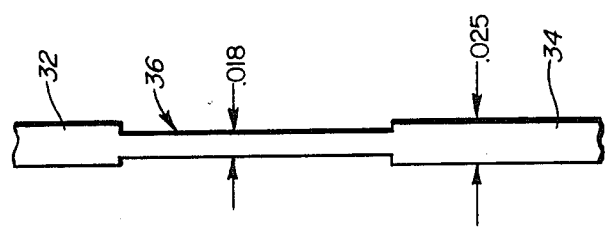

After the pre-milling operation, a die is used to form individual pins to the shape shown in top plan in FIG. 6a, where each individual pin formed from the continuous sheet 50 has an intermediate compliant section 36 with a width of 0.042 inch and a tail 34 having a width of 0.025 inch. As shown in FIG. 6b, the compliant section 36 has been pre-milled to a thickness of 0.018 inch, while the end portions of the pin remain the original thickness of the sheet 50 which is 0.025 inch. As a result, the pin as shown in FIGS. 6a and 6b has a rectangular compliant section 36 which measures 0.042 inch by 0.018 inch, and has a tail with a square cross section measuring 0.025 inch.

Figure 7A:
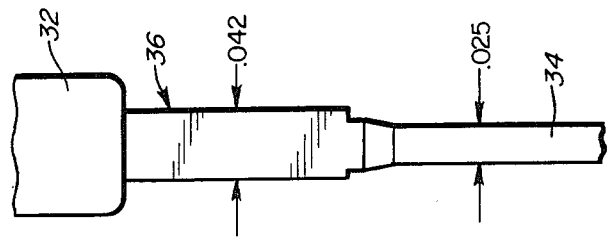
FIGS. 7a and 7b are similar to FIGS. 6a and 6b except they illustrate a further method step where the elongated compliant section, which is rectangular in cross-section, has the four corners thereof coined prior to the shearing operation which forms the two individual leg members shown in FIGS. 2–4.
Figure 7B:
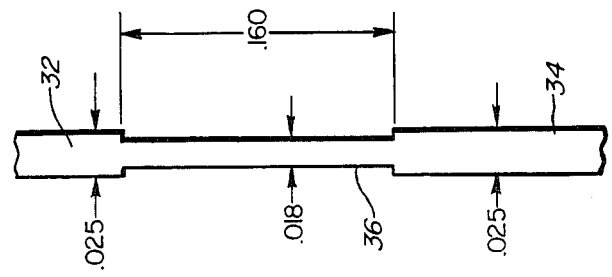

The next operation is illustrated by FIGS. 7a and 7b and involves coining of the four corner edges of the compliant section 36, which in the example given herein has a length of 0.160 inch, i.e., the width of the strip which was reduced to 0.018 inch thickness during the pre-milling operation. Thereafter, a shearing or punching operation is carried out on the compliant section 36 to shear the two sides thereof in opposite directions and thereby form the individual legs 38 and 40 as shown in FIGS. 2 and 3. The stroke of the shearing or punching operation is controlled to produce the important dimension shown by way of example as 0.048 inch in FIG. 3. Moreover, the split or shear line between the two legs, shown by way of example in FIG. 2 to have a length of 0.140 inch, is a factor in determining the length and flexibility of the individual legs 38 and 40.

It will now be understood why the pre-milling operation is an important feature of the present invention. By means of that operation the thickness of the compliant section 36 is accurately controlled to a thickness of 0.018 inch (as shown in FIG. 7b). Comparing the foregoing with FIG. 3, which shows the pin after the shearing operation to create the individual legs 38 and 40, it will be understood that the width of each leg (as shown in FIG. 3) is 0.018 inch, precisely the thickness of the compliant section 36 (shown in FIG. 7b).

Thus, by pre-milling the elongated strip shown at 52 in FIG. 5a, and by shearing the two legs 38 and 40 from that same strip, each of the legs 38 and 40 (as shown in FIG. 3) is assured of having precisely the same width, thereby minimizing the possibility of the two legs exhibiting differing flexibility characteristics.

Moreover, in addition to the importance of providing that the legs 38 and 40 exhibit similar flexibility characteristics, it is also important to control the width of the legs 38 and 40 in order to control the pin insertion and pin pull-out forces.

The compliant pin of the present invention has the advantage that due to its increased flexibility it minimizes damage to a plated-through hole into which it is pressed, and at the same time it readily meets required maximum insertion forces and minimum pull-out forces, while being exceptionally well adapted for use with variable hole diameters. Moreover, the method of the present invention eliminates serious problems encountered where punching apparatus is used to punch two coplanar legs from a flat sheet of metal.

The method of the present invention affords the further advantage of producing compliant pins at a lower cost than conventional methods, and in a more reliable manner with less breakdown of manufacturing tooling. It will also be understood that locking forces, both insertion forces and pull out forces, can be controlled with unusual accuracy by use of the manufacturing step whereby the width of each of the two compliant legs is controlled by the thickness of the compliant section (shown for example in FIG. 6b) which is readily adjusted during the pre-milling operation.

We claim:

1. A method of producing compliant pins from an elongated metal sheet comprising the steps of pre-milling opposite sides of the sheet to produce an elongated strip of reduced thickness intermediate the edges of said sheet, forming individual pins from said sheet to form head and tail portions and an intermediate section which is formed from said strip of reduced thickness, and shearing each individual pin, in a direction generally perpendicular to the plane of said sheet, in said intermediate section of reduced thickness and forming said intermediate section into a pair of outwardly bowed arcuate legs in different planes defining an opening therebetween, including bowing each leg in a direction transverse to the plane of the metal sheet and opposite to the bowing direction of the other leg.

2. A method as defined in claim 1 where said intermediate section is generally rectangular in cross-section.

3. A method as defined in claim 1 where the width of the pre-milled strip is at least approximately equal to the desired length of the compliant section of said pin.

4. A method as defined in claim 1 where the stroke of the shearing operation is sufficient to separate the two legs substantially throughout their length thereby substantially eliminating overlapping of said legs.

5. A method of producing compliant pins from an elongated metal sheet comprising the steps of pre-milling opposite sides of said sheet to produce an elongated strip of reduced thickness intermediate the edges of said sheet, the width of said strip being at least approximately equal to the desired length of the compliant section of said pin, forming individual pins from said sheet to form head and tail portions and an intermediate section which is formed from said strip of reduced thickness, said intermediate section being generally rectangular in cross-section, and shearing each individual pin, in a direction generally perpendicular to the plane of said sheet, in said intermediate section of reduced thickness and forming said intermediate section into a pair of outwardly bowed arcuate legs in different planes defining an opening therebetween, including bowing each leg in a direction transverse to the plane of the metal sheet and opposite to the bowing direction of the other leg, the stroke of said shearing operation being sufficient to separate the two legs substantially through their length thereby substantially eliminating overlapping of said legs.

6. A method as defined in claim 5 where the width of the pre-milled strip corresponds approximately to the desired length of the compliant section.

7. A method as defined in claim 5 where prior to the shearing operation the intermediate section of reduced thickness is subjected to a coining operation to coin the four edges of the section.

* * * * *